(12) United States Patent
Subramanian et al.

(10) Patent No.: US 6,348,406 B1
(45) Date of Patent: Feb. 19, 2002

(54) METHOD FOR USING A LOW DIELECTRIC CONSTANT LAYER AS A SEMICONDUCTOR ANTI-REFLECTIVE COATING

(75) Inventors: Ramkumar Subramanian, San Jose; Minh Van Ngo; Kashmir Sahota, both of Fremont; Yongzhong Hu, San Jose; Hiroyuki Kinoshita, Sunnyvale; Fei Wang, San Jose; Wenge Yang, Fremont, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/586,264

(22) Filed: May 31, 2000

(51) Int. Cl.⁷ .......................................... H01L 21/4763
(52) U.S. Cl. ...................... 438/636; 438/631; 438/633; 438/637
(58) Field of Search ................................ 438/622, 637, 438/626, 631, 633, 636, 952

(56) References Cited

U.S. PATENT DOCUMENTS 5,733,712 A * 3/1998 Tanaka et al. ............... 430/314
5,986,344 A * 11/1999 Subramanion et al. ...... 257/760
6,008,120 A 12/1999 Lee .............................. 438/634
6,174,810 B1 * 1/2001 Ialam et al. ................. 438/687

FOREIGN PATENT DOCUMENTS

EP              975017         *  1/2000

* cited by examiner

Primary Examiner—Trung Dang
(74) Attorney, Agent, or Firm—Mikio Ishimaru

(57) ABSTRACT

The present invention provides a method for manufacturing a semiconductor device with an anti-reflective coating (ARC) that does not need to be removed. In one embodiment, electrical devices are formed on a semiconductor substrate. A dielectric layer is then deposited over the electrical devices and the semiconductor substrate, upon which an optically transparent ARC layer of low dielectric constant is then deposited. Photoresist is then deposited on top of the ARC layer and is then photolithographically processed and subsequently developed. The dielectric layer is then etched down to the semiconductor substrate to form contacts or local interconnects. The ARC layer can subsequently be used as a hard mask and does not require removal.

16 Claims, 4 Drawing Sheets

METHOD FOR USING A LOW DIELECTRIC CONSTANT LAYER AS A SEMICONDUCTOR ANTI-REFLECTIVE COATING

CROSS-REFERENCE TO RELATED APPLICATION(S)

The present application contains subject matter related to a concurrently filed U.S. Patent Application by Ramkumar Subramanian, Wenge Yang, Marina V. Plat, and Lewis Shen entitled "SEMICONDUCTOR MANUFACTURING METHOD USING A DIELECTRIC PHOTOMASK". The related application is assigned to Advanced Micro Devices, Inc. and is identified by docket number D961.

The present application contains subject matter related to a concurrently filed U.S. Patent Application by Ramkumar Subramanian, Minh Van Ngo, Suzette K. Pangrle, and Kashmir S. Sahota entitled "SEMICONDUCTOR MANUFACTURING METHOD USING A HIGH EXTINCTION COEFFICIENT DIELECTRIC PHOTOMASK". The related application is assigned to Advanced Micro Devices, Inc. and is identified by docket number D962.

The present application also contains subject matter related to a concurrently filed U.S. Patent Application by Ramkumar Subramanian, Minh Van Ngo, Suzette K. Pangrle, Kashmir S. Sahota, and Christopher F. Lyons entitled "METHOD FOR CREATING PARTIALLY UV TRANSPARENT ANTI-REFLECTIVE COATING FOR SEMICONDUCTORS". The related application is assigned to Advanced Micro Devices, Inc. and is identified by docket number D963.

The present application also contains subject matter related to a concurrently filed U.S. Patent Application by Ramkumar Subramanian, Minh Van Ngo, Kashmir S. Sahota, YongZhong Hu, Hiroyuki Kinoshita, Fei Wang, and Wenge Yang entitled "METHOD FOR ELIMINATING ANTI-REFLECTIVE COATING IN SEMICONDUCTORS". The related application is assigned to Advanced Micro Devices, Inc. and is identified by docket number D971.

TECHNICAL FIELD

The present invention relates generally to memory devices and more particularly to a method for creating an anti-reflective coating that does not have to be removed.

BACKGROUND ART

Memory devices, such as a Flash electrically erasable programmable read only memory (EEPROM), are a class of nonvolatile memory devices that are programmed by hot electron injection and erased by Fowler-Nordheim tunneling.

Each memory cell is formed on a semiconductor substrate (i.e., a silicon die or chip), having a heavily doped drain region and a source region embedded therein. The source region further contains a lightly doped deeply diffused region and a more heavily doped shallow diffused region embedded into the substrate. A channel region separates the drain region and the source region. The memory cell further includes a multi-layer structure, commonly referred to as a "stacked gate" structure or word line. The stacked gate structure typically includes: a thin gate dielectric layer or tunnel oxide layer formed on the surface of substrate overlying the channel region; a polysilicon floating gate overlying the tunnel oxide; an interpoly dielectric layer overlying the floating gate; and a polysilicon control gate overlying the interpoly dielectric layer. Additional layers, such as a silicide layer (disposed on the control gate), a poly cap layer (disposed on the silicide layer), and a silicon oxynitride layer (disposed on the poly cap layer) may be formed over the control gate. A plurality of Flash EEPROM cells may be formed on a single substrate.

The process of forming Flash EEPROM cells is well known and widely practiced throughout the semiconductor industry. After the formation of the memory cells, electrical connections, commonly known as "contacts", must be made to connect the stack gated structure, the source region and the drain regions to other part of the chip. The contact process starts with the formation of sidewall spacers around the stacked gate structures of each memory cell. An etch-stop layer, typically a nitride material such silicon nitride, is then formed over the entire substrate, including the stacked gate structure, using conventional techniques, such as chemical vapor deposition (CVD). A dielectric layer, generally of oxide, is then deposited over the nitride layer. A layer of photoresist is then placed over the dielectric layer and is photolithographically processed to form the pattern of contact openings. An anisotropic etch is then used to etch out portions of the dielectric layer to form source and drain contact openings. The contact openings stop at the source and drain regions in the substrate. The photoresist is then stripped, and a conductive material, such as tungsten, is deposited over the dielectric layer and fills the source and drain contact openings to form so-called "self-aligned contacts" (conductive contacts). The substrate is then subjected to a chemical-mechanical polishing (CMP) process which removes the conductive material above the dielectric layer to form the conductive contacts through a contact CMP process.

As semiconductor devices have shrunk in size, the industry has turned towards deep ultraviolet (DUV) lithography as a photolithographic process to pattern contact openings in sub-0.35 micron line geometry semiconductor devices.

A major obstacle to the miniaturization of semiconductors is the effect of reflectivity in the DUV lithographic and conventional i-line lithographic processes. Reflections occur at the junctions of materials and are influenced in part by the thickness of materials. Because the precision of the photolithographic process is sensitive to such reflections, reducing the reflections by lowering the reflectivity of materials under about 15% is essential. In particular, the differences in thickness caused by the polysilicon, metal, and poly/metal stacks has made small feature patterning and critical dimension (CD) control of photoresist very difficult. Such topography causes unpredictable swings in material reflectivity and needs to be reduced or dampened in some way in order to reduce semiconductor device size. Non-uniformities occurring when the dielectric layer undergoes CMP can increase the total reflectivity from the dielectric to the photoresist during photolithography and cause further disruptions in patterning.

To solve this problem, different anti-reflective coatings (ARCs) have been developed which work by phase shift cancellation of specific wavelengths to provide uniform resist patterning. Top anti-reflective coatings (TARCs) are placed on top of the photoresist and are specifically designed so that the reflective light from the resist/ARC interface is equal in amplitude but opposite in phase to the light reflected from the ARC/reflective layer interface.

It has been found that there are certain line width variations which are due to the ARC not being able to reduce the reflective layer reflectivity to a minimum. The reflectivity causes problems with the resist which have been corrected in part by the use of bottom anti-reflective coatings (BARCs) located under the resists.

Silicon oxynitride (SiON) by itself has been found to be a good BARC material. In essence, the silicon oxynitride BARC serves two functions during semiconductor memory manufacturing: (1) as a hard mask during self-aligned etch (SAE) and during self-aligned-source etch; and (2) as a bottom anti-reflective layer for photolithography at second gate masking. In order for the silicon oxynitride to act as an adequate hard mask, it must be approximately 100 nm thick in current applications. However, the ideal BARC thickness is approximately 30 nm, which is not thick enough to survive the SAE and self-aligned source etching processes. Thus, a 100 nm silicon oxynitride BARC is currently required and this causes line widths to be non-uniform. The non-uniform line width is a result of lensing reflections of light into the photoresist from undulations in the topography of reflective layers under the BARC that are not completely phase cancelled by the BARC.

One significant problem with ARCs is that they are not transparent to the ultra-violet light normally used when erasing Flash memories. While this is not a problem in most non-memory semiconductor devices, in this case, the BARC layer must be removed as an added step to the creation process.

The BARC layer is often removed anyways because, left in, the BARC layer would also create capacitance between the contacts because of its relatively high dielectric constant and would greatly reduce the transistor switching speed. This would add to the adverse speed impact which increases disproportionately with shortened channels. Basically, the parasitic capacitance due to lightly doped drain (LDD) structures as a percentage of the total transistor capacitance is higher for sub-0.18 micron transistors than it is for a 0.18 micron transistor and even worse for a sub-0.13 transistor, making the overall adverse speed impact much more severe in smaller transistors.

Although removal of the ARC is necessary for the above reasons, the actual removal process causes problems. The most significant problem is the cost and complexity in adding ARC removal steps.

Attempts have been made to develop a thin photoresist layer which would allow for the removal of ARC layers as a byproduct of existing etching steps, thus avoiding the additional cost of and complexity. However, it is extremely difficult to deposit and polish a sufficiently thin layer of defect-free photoresist.

Another problem is that the CMP that is used in the removal process of the BARC layer inherently removes portions of the conductive contacts as well as the dielectric layer, producing deep scratches therein. The scratches vary significantly from memory cell to memory cell, creating non-uniformity and adversely affecting device performance.

Rather than use CMP, attempts have been made to develop an etch chemistry that is more selective so that the ARC would be etched at a much higher rate than the conductive contacts and the dielectric layer. Unfortunately, these attempts have been unsuccessful.

A solution, which would provide an ARC layer of sufficient thickness to act as a mask, produce the uniform line width required as semiconductors are reduced in size, and eliminate the scratching of the dielectric layer associated with the removal of the BARC, has long been sought but has eluded those skilled in the art. As miniaturization continues at a rapid pace in the field of semiconductors, it is becoming more pressing that a solution be found.

DISCLOSURE OF THE INVENTION

The present invention provides a method of manufacturing a semiconductor device by forming a plurality of semiconductor devices on a semiconductor substrate. A dielectric layer is then deposited and polished to form a planar surface. Then, an ARC layer of low dielectric constant is deposited and a layer of photoresist for patterning contacts and local interconnects (LI) on the low dielectric constant layer is deposited. The low dielectric constant layer is then etched to form contacts and LI. Thus, the method provides an anti-reflective coating (ARC) for a semiconductor device that does not need to be removed.

The present invention further provides a method of manufacturing a semiconductor device with an optically transparent ARC at UV wavelengths commonly used in DUV lithography.

The present invention further provides a method of manufacturing a semiconductor device with an ARC with a low dielectric constant. Since a material with low dielectric constant would not increase the capacitance between contacts, such an ARC eliminates the need for a removal step.

The present invention further provides a method of manufacturing a semiconductor device with an ARC with optimized optical constants which can reduce the reflectivity from a reflective layer at a particular wavelength towards zero while, at the same time, being adequately thick to serve as a mask for etch.

The present invention further provides a method of manufacturing a semiconductor device with an ARC composed of a low dielectric material such as HSQ, BCB, Flare, or Silk. Because such low dielectric materials are optically transparent at the DUV wavelengths being used (248 nm), the thickness of the ARC can be chosen to be adequately thick to serve as a hard mask for self-aligned etch and self-aligned-source etch and, at the same time, to satisfy an under 15% reflectivity requirement.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
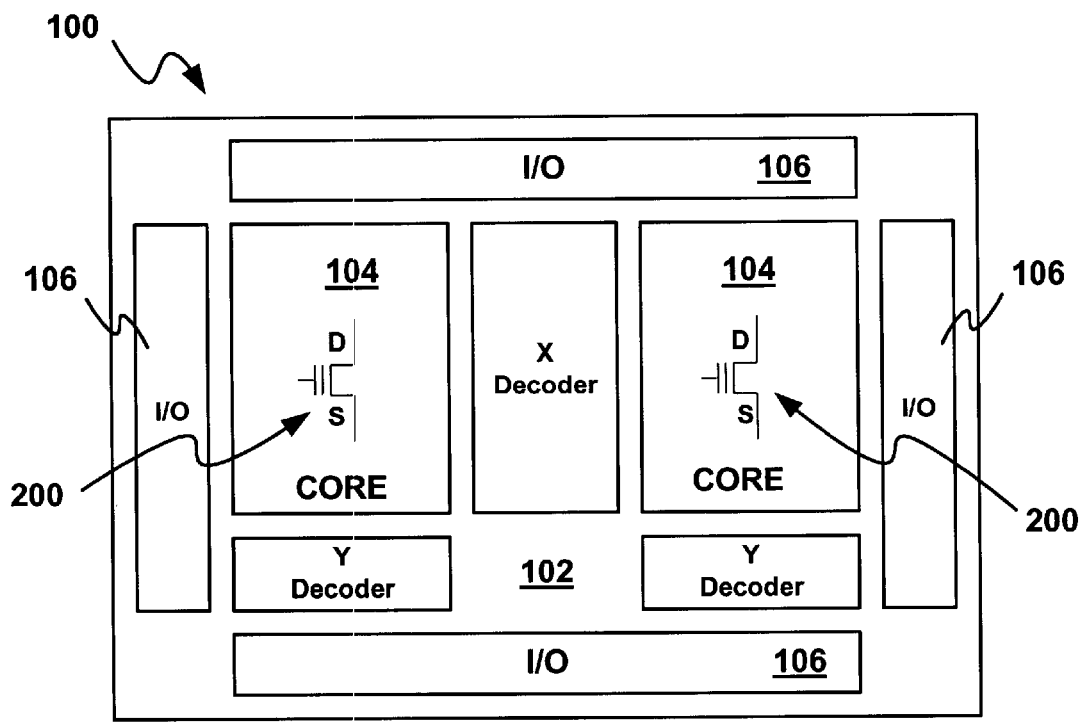
FIG. 1 (PRIOR ART) is a plan view of a conventional memory device.

Referring now to FIG. 1 (PRIOR ART), therein is shown a plan view of a conventional memory device, a Flash EEPROM 100 which commonly includes a semiconductor substrate 102 in which one or more high-density core regions and one or more low-density peripheral portions are formed. High-density core regions typically include one or more M×N array cores 104 of individually addressable, substantially identical memory cells 200. Low-density peripheral portions 106 typically include input/output (I/O) circuitry and circuitry for selectively addressing the individual memory cells. The selective addressing circuitry typically includes one or more x-decoders and y-decoders, cooperating with the I/O circuitry for connecting the source, gate, and drain of selected addressed memory cells to predetermined voltages or impedances, to effect designated operations on the memory cell, e.g., programming, reading and erasing, and deriving necessary voltages to effect such operations.

Figure 2A:
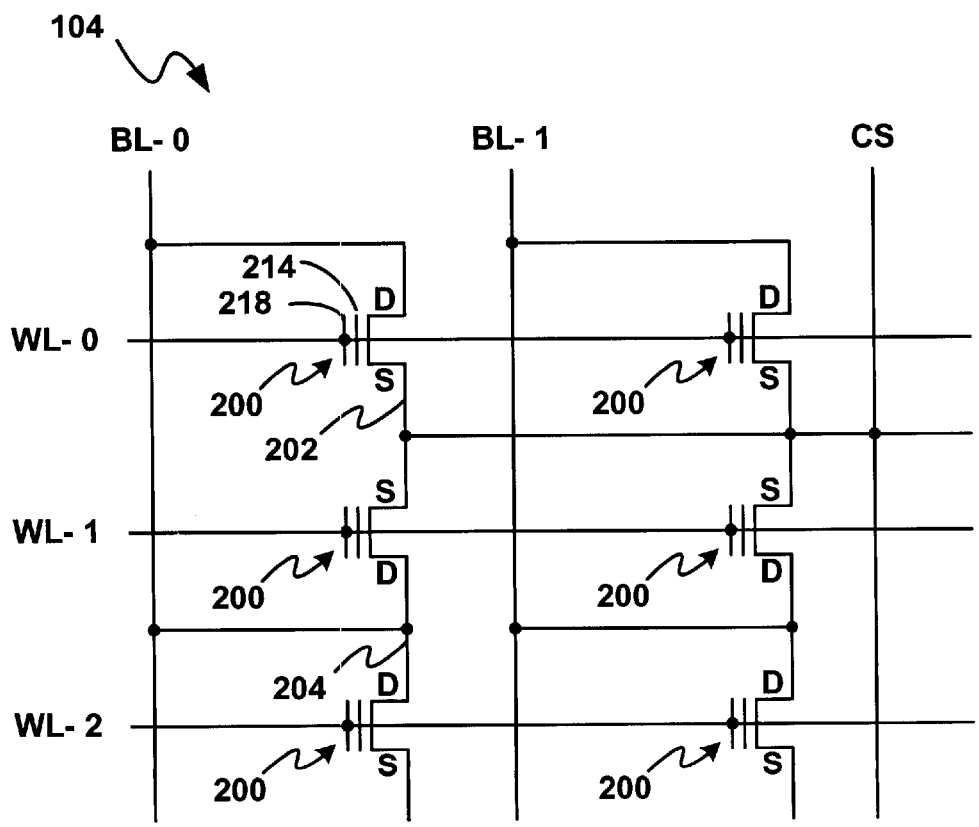
FIG. 2A (PRIOR ART) is schematic diagram of a portion of a memory cell array.
Figure 2B:
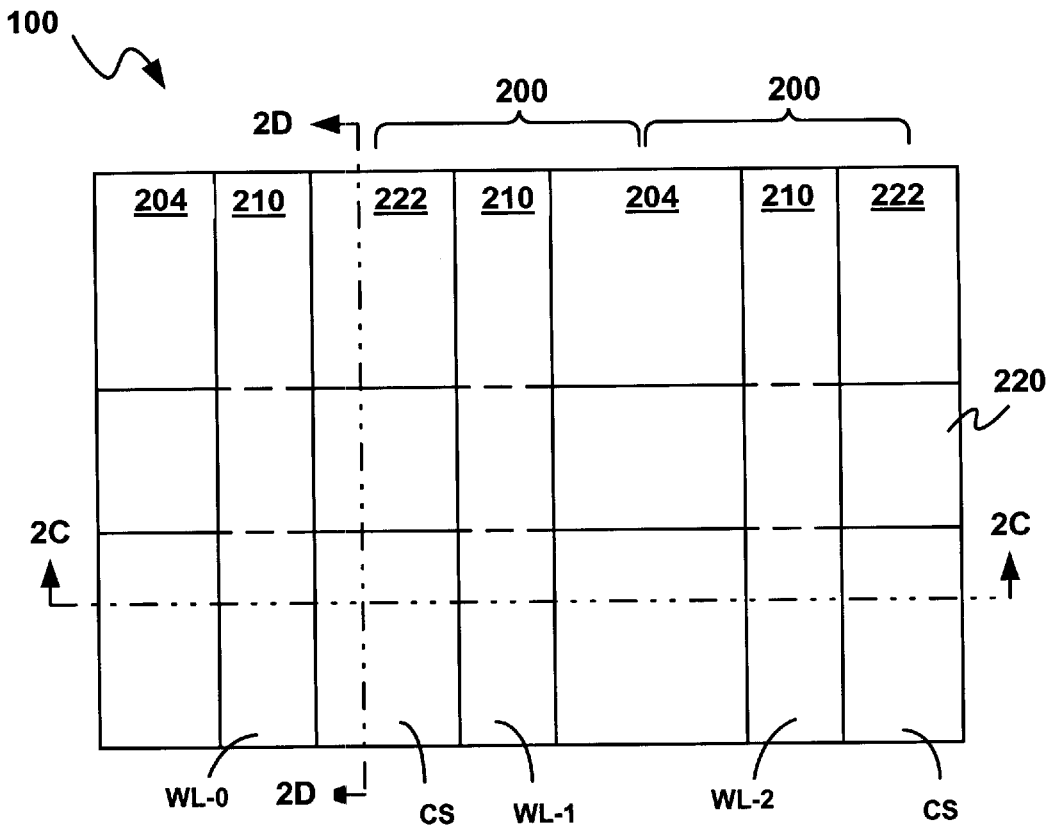
FIG. 2B (PRIOR ART) is a plan view of a portion of an intermediate state (partially complete) of a memory cell array core.
Figure 2C:
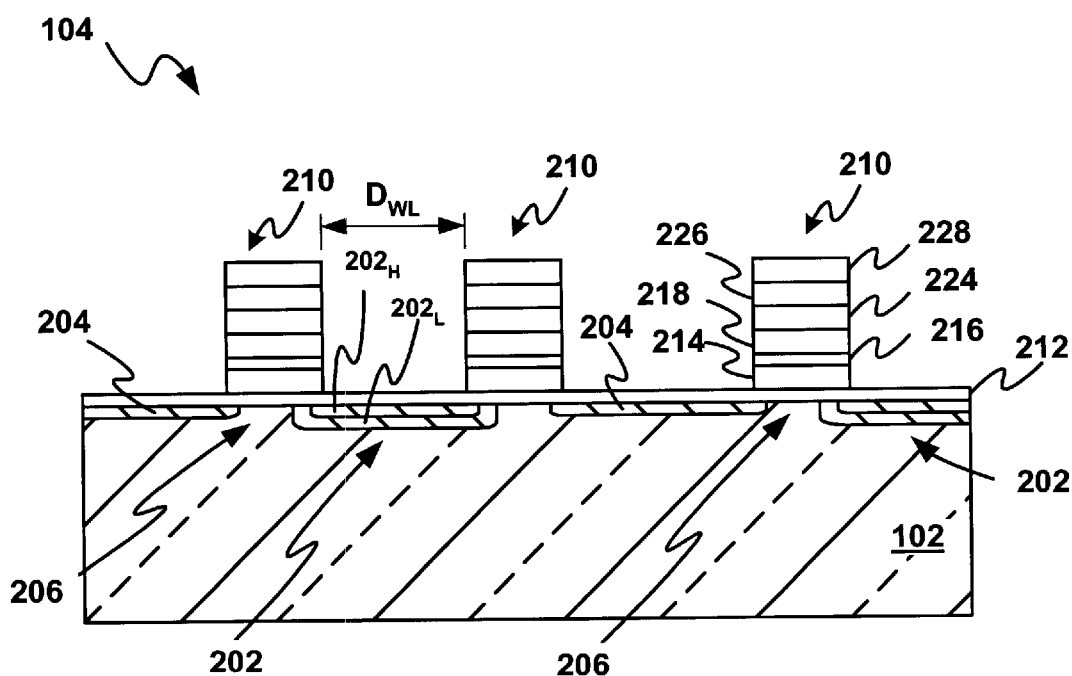
FIG. 2C (PRIOR ART) is a simplified cross section of FIG. 2B (PRIOR ART) along line 2C—2C.

Referring now to FIG. 2A (PRIOR ART), therein is shown a schematic diagram of a portion of a memory cell array in which each memory cell 200 in array core 104 typically comprises a source 202, a drain 204, and a channel 206 (shown in FIG. 2C (PRIOR ART)).

Referring now to FIG. 2B (PRIOR ART), therein is shown a plan view of a portion of an intermediate state (partially complete) of a memory cell array core 104.

Referring now to FIG. 2C (PRIOR ART), therein is shown a simplified cross section of FIG. 2B (PRIOR ART) along line 2C—2C. The source 202, drain 204, and channel 206 semiconductor regions are shown formed in semiconductor substrate 102 (or in an isolation well) and multi-layer structures, commonly referred to as "stacked gate" (word line) structures 210. The stacked gate structures 210 include: a thin gate dielectric layer 212 (commonly referred to as the "tunnel oxide") formed on the surface of substrate 102 overlying the channel 206, a floating gate 214 overlying the gate dielectric layer 212, an interpoly (inter-gate) dielectric layer 216 overlying the floating gate 214, and a control gate 218 overlying the interpoly dielectric layer 216. Additional layers, such as a silicide layer 224 (disposed on the control gate 218), a poly cap layer 226 (disposed on the silicide layer 224), and a silicon oxynitride layer 228 (disposed on the poly cap layer 226) may be formed over the control gate 218. The memory cells 200 are arranged in a series of rows and columns.

In the completed array, the control gates 218 of the memory cells 200 in a row are formed integral to a common word line (WL) associated with the row. Columns of memory cells are arranged such that adjacent memory cells in a column share a common semiconductor region as a source or drain region. The source 202 of each memory cell in a column (except end memory cells) is formed in a common region with one of the adjacent memory cells, e.g., the preceding memory cell in the column. Likewise, the drain of the memory cell is formed in a common region with the drain 204 of the other adjacent memory cell, e.g., the next succeeding memory cell in the column (except end memory cells). The drain 204 of each memory cell in a column of memory cells is connected by a conductive bit line (BL) (FIG. 2A (PRIOR ART)), including an overlying layer of metal connected to each drain 204 of the memory cells 200 within the column. Additionally, the sources 202 of each memory cell 200 in a row (and hence pairs of rows) are interconnected by a common source line CS (FIG. 2A (PRIOR ART)) formed in the substrate 102, as will be described. Any particular memory cell 200 within the array cores 104 can be individually addressed (programmed and read) by operating upon one word line and one bit line.

Typically, in forming an EEPROM 100, a pattern of field oxide regions 220 (FIG. 2B (PRIOR ART)) is initially formed to provide electrical isolation between the respective devices of EEPROM 100. For example, field oxide regions 220 are used to provide isolation between the array cores 104 and the devices of peripheral portions 106, as well as between the various columns of memory cells 200 within the array cores 104. Field oxide regions 220 are conventionally formed using a mask and selective growth process: a layer of thermal oxide ("barrier oxide" or "pad oxide") is grown or deposited over the surface of the substrate 102; a mask, frequently composed of nitride, is deposited on the barrier oxide, and patterned to cover those regions of the substrate 102 in which devices are to be formed (herein referred to as active regions); field oxide is grown in the exposed areas of the barrier oxide, by for example, the local oxidation of silicon (LOCOS); and the masking layer and barrier oxide are stripped to expose the underlying substrate 102. In general, referring to FIG. 2B (PRIOR ART), within the array cores 104, the selective growth process results in alternating parallel strips of field oxide regions 220 and exposed regions corresponding to the columns of memory cells 200 in the array.

The stacked gate (word line) structures 210 are then typically formed. For example, a gate dielectric layer 212, comprising a thin (e.g. approximately 100 angstroms) layer of oxide, is initially formed on the substrate 102 by a technique, such as thermal oxidation of the surface of the substrate 102 or by depositing a suitable material on the substrate 102. A layer of conductive polysilicon (e.g., polycrystalline silicon), that will ultimately form the floating gates 214, is typically then formed on the gate dielectric layer 212. For example, conductive polysilicon may be deposited by a number of different techniques, e.g., furnace-grown polysilicon. The polysilicon layer is typically then masked and etched to remove strips overlying the field oxide regions 220, leaving isolated strips of polysilicon on top of the gate dielectric layer 212 overlying the substrate regions corresponding to the columns of memory cells 200 of the array core 104 (i.e. the regions in which source, channel, and drain regions of memory cells in the column will be formed). A layer of dielectric material, such as, e.g., an oxide-nitride-oxide (ONO) layer, that will ultimately form an interpoly dielectric layer 216 is typically then formed by a suitable technique. For example, where the interpoly dielectric layer 216 is ONO, it is formed by growing a layer of oxide, depositing a layer of nitride, followed by growing another layer of oxide. The interpoly dielectric layer 216, in the completed array, insulates control gates 218 from floating gates 214 in the individual memory cells and electrically isolates the adjacent columns of the floating gates 214 in the array core 104. Another layer of conductive polysilicon (e.g., polycrystalline silicon), that will ultimately form the control gates 218 and the word lines WL connecting the control gates 218 of the memory cells in the respective rows of the array core 104, referred to as the control gate 218, is typically then thermally grown on the interpoly dielectric layer 216. Portions of the control gate 218 and the interpoly dielectric layer 216 are typically then selectively removed to define the stacked gate structures 210 on the gate dielectric layer 212, i.e., to form the floating gates 214, the interpoly dielectric layer 216, control gates 218 of the individual memory cells, and the word lines WL (portions of the interpoly dielectric layer 216 and control gate polysilicon layer bridge field oxide regions 220 to connect the respective memory cells of the rows of the core array). This is typically affected by masking and etching techniques.

When completed, this etch creates the generally parallel, stacked gate (word line) structures 210 separated by a distance $D_{WL}$, as shown in FIG. 2C (PRIOR ART). A silicide layer 224 is typically provided over the control gate 218 layer to reduce resistance. Thereafter, a polysilicon layer (commonly referred to as a "poly cap" layer) 226 is formed over the silicide layer 224 to serve as a cap layer for the stacked gate structures 210. Next, a silicon oxynitride layer 228 may be formed over the poly cap layer 226. The combination of the poly cap layer 226 and the silicon oxynitride layer 228 is commonly referred to as a "passivation layer". Thereafter, portions of the silicon oxynitride layer 228 are partially removed using conventional masking and etching techniques to define the final stacked gate structures 210.

Conventionally, the portions of the field oxide regions 220 and the gate dielectric layer 212 between every second pair of adjacent stacked gate (word line) structures 210 in the array core 104 (i.e., the regions, generally indicated as 222, where the sources 202 are to be formed and the portions of the field oxide regions 220 disposed between sources 202 of the corresponding memory cells of adjacent columns) are then typically removed in preparation for formation of the common line CS (not shown)) connecting the sources 202. This is typically effected using a conventional Self-Aligned Source (SAS) etch.

Figure 2D:
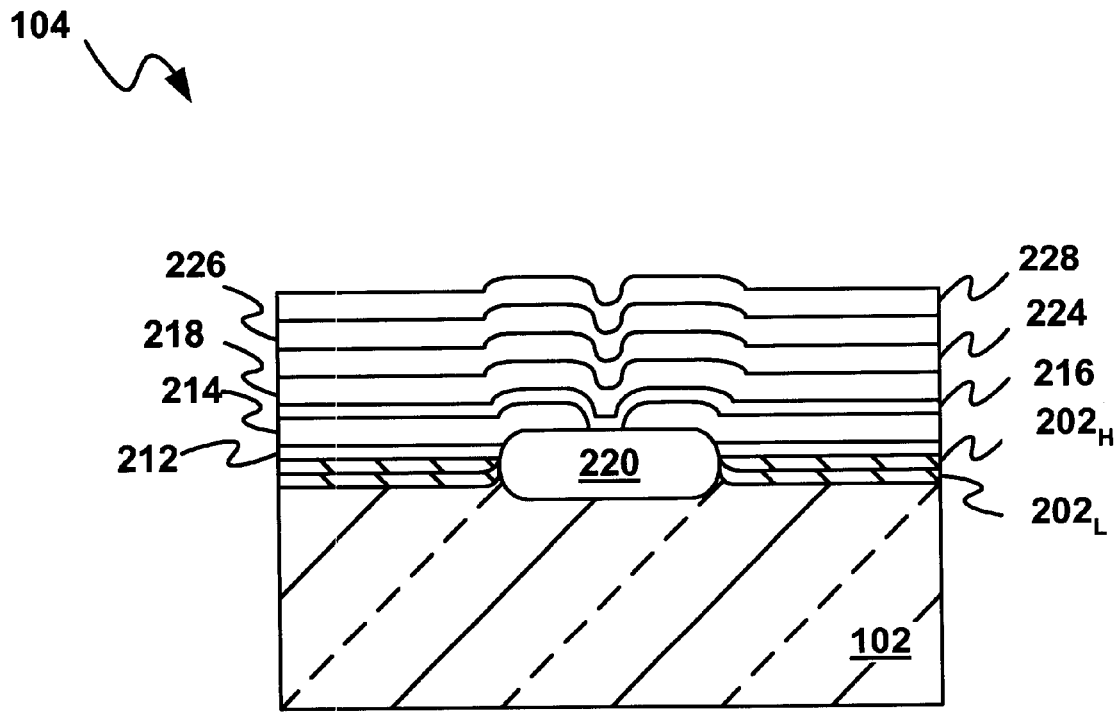
FIG. 2D (PRIOR ART) is a simplified cross section of FIG. 2B (PRIOR ART) along line 2D—2D.

Referring now to FIG. 2D (PRIOR ART), therein are shown the source 202, common line CS, and drain 204 regions formed in a conventional process. The source 202 and the common source line CS are typically formed by initially effecting a conventional double diffusion implant (DDI) with the SAS mask still in place. The DDI implants a first dopant (e.g. n-type, such as phosphorous) to form a deeply diffused, but lightly doped, N well $202_L$ establishing a graded source-channel junction as shown in FIG. 2D (PRIOR ART) which is a simplified cross section of FIG. 2B (PRIOR ART) along line 2D—2D. The SAS mask is then removed. The DDI implant is typically driven deeper into the substrate 102 by subjecting the substrate 102 to a thermal cycle at high temperature (e.g. 1050 degrees Celsius). A shallow second implant, commonly referred to as a medium diffused drain (MDD) implant, is then performed (e.g., with arsenic) to create a more heavily doped, but shallower, n+ well $202_H$ embedded within deep N well $202_L$. The MDD implant also forms a shallow, abrupt drain 204.

Figure 3:
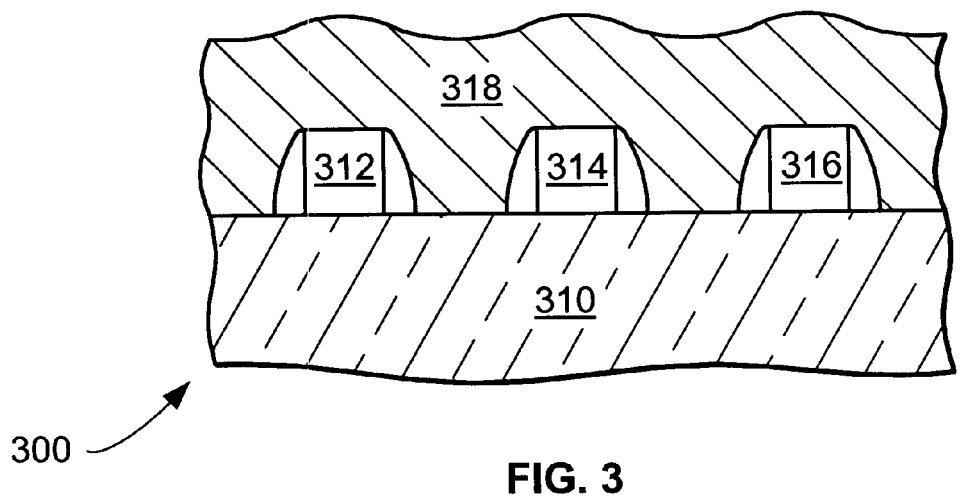
FIG. 3 shows a cross-section of a portion of a semiconductor device in an intermediate stage of processing.

Referring now to FIG. 3, therein is shown a cross-section of a portion of a semiconductor 300 in an intermediate stage of processing. A silicon (Si) substrate 310 has a plurality of semiconductor devices, such as transistors 312, 314, and 316 disposed thereon.

Deposited over the surface of the Si substrate 310 and the transistors 312, 314, and 316 is a dielectric layer 318 of a material such as boro-phospho-tetra-ethyl-ortho silicate (BPTEOS), plasma enhanced tetra-ethyl-ortho silicate (PETEOS), or other TEOS glass which has a relatively high dielectric constant in the order of 24.0.

Figure 4:
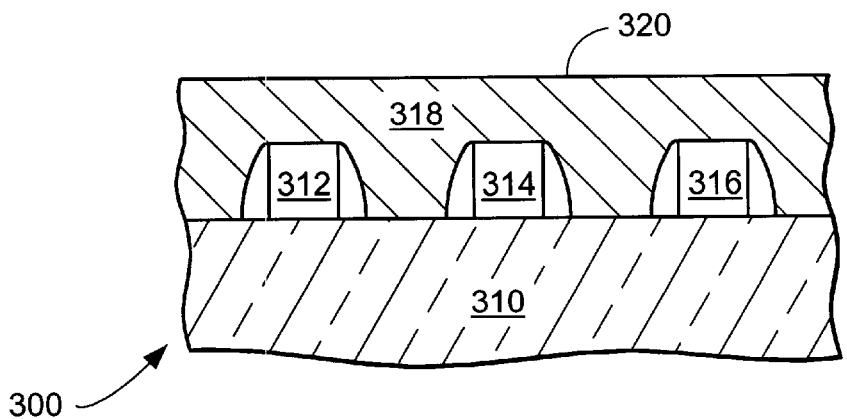
FIG. 4 shows the structure of the semiconductor device in FIG. 3 after chemical mechanical polishing (CMP) of the dielectric layer to form the planar surface.

Referring now to FIG. 4, therein is shown the structure of FIG. 3 after chemical mechanical polishing (CMP) of the dielectric layer 318 to form the planar surface 320.

Figure 5:
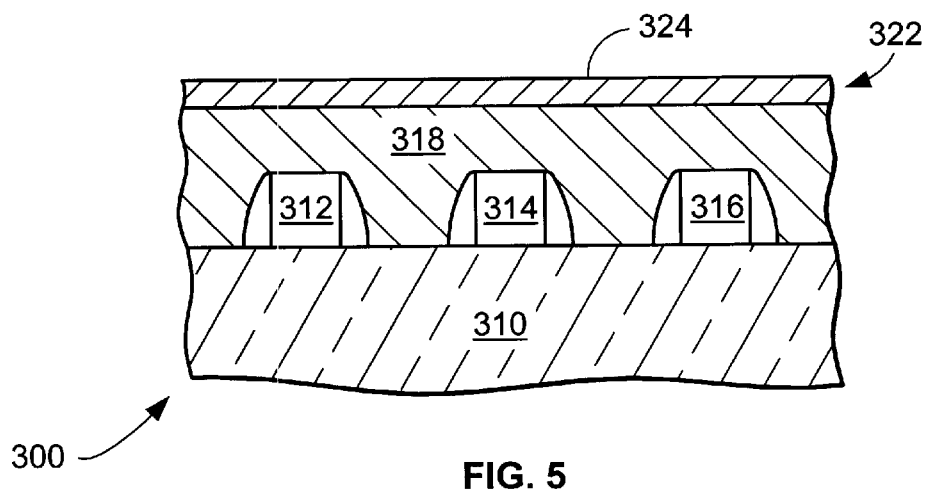
FIG. 5 shows the structure of the semiconductor device in FIG. 4 having an ARC layer with a low dielectric constant deposited on the planar surface.

Referring now to FIG. 5, therein is shown the structure of FIG. 4 having an ARC layer 322 with low dielectric constant layer deposited on the planar surface 320. The ARC layer 322 is a conventional material such as Flare, Silk, SCB, etc., which has a low dielectric constant in the area of about 4.0, a reflectivity under 15%, and an adjustable optical constant, such as an extinction coefficient below 0.2. The ARC layer 322 is deposited in a relatively thin thickness, below 400 Å and below ¼ the thickness of the subsequent photoresist thickness, so as to be conformal with and thus have a planar top surface 324.

Figure 6:
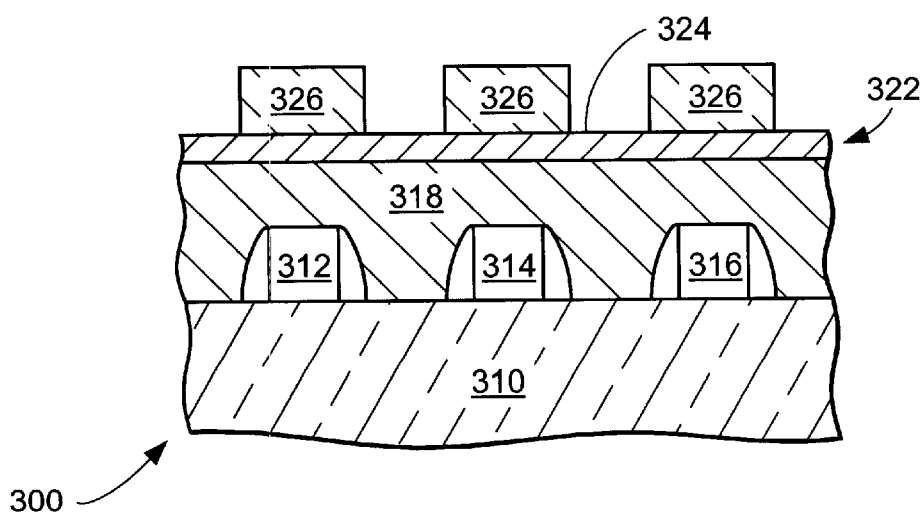
FIG. 6 shows the structure of the semiconductor device in FIG. 5 after a photoresist has been deposited on the planar surface of the ARC, been conventionally patterned, photolithographically processed, and developed.

Referring now to FIG. 6, therein is shown the structure of FIG. 5 after a photoresist 326 has been deposited on the planar surface of the ARC layer 322, been conventionally patterned, photolithographically processed, and developed. The ARC layer 322 acts as a bottom anti-reflective coating (BARC) for the photoresist 326.

After the processing to form the structure of FIG. 6, the ARC layer 322 is used as the mask for forming the contacts or local interconnects as would be evident to those skilled in the art. Since the ARC layer 322 is composed of a material with a low dielectric constant and has UV transparent properties, it will not cause additional capacitance between contacts and will still allow for UV erasing. These properties allow the ARC layer 322 to remain in place while additional processing steps are performed to complete an integrated circuit. Thus, this ARC layer does not have to be removed.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method of manufacturing a semiconductor comprising the steps of:
   providing a semiconductor substrate;
   forming a semiconductor device on and in the semiconductor substrate;
   depositing a dielectric layer over the semiconductor substrate and the semiconductor device;
   planarizing the dielectric layer to form a planar surface;
   depositing a low dielectric constant layer on the planar surface over the dielectric layer, the low dielectric constant layer having an extinction coefficient below 0.2;
   depositing a photoresist over the dielectric layer;
   processing the photoresist to provide patterned openings therein for forming connections for the semiconductor device; and
   processing the low dielectric constant layer and the dielectric layer to form connections for the semiconductor device.

2. The method of manufacturing a semiconductor as claimed in claim 1 wherein the step of depositing a low dielectric constant layer uses a material having a dielectric constant below 4.0.

3. The method of manufacturing a semiconductor as claimed in claim 1 wherein the step of depositing a dielectric layer uses a material having a dielectric constant above 24.0.

4. The method of manufacturing a semiconductor as claimed in claim 1 wherein the step of depositing the dielectric layer uses a material selected from a group consisting of BPTEOS, PETEOS, TEOS, and combinations thereof.

5. The method of manufacturing a semiconductor as claimed in claim 1 wherein the step of depositing a low dielectric constant layer uses a material selected from a group consisting of Flare, Silk, SCB, and combinations thereof.

6. The method of manufacturing a semiconductor as claimed in claim 1 wherein the low dielectric constant layer has a thickness ratio of ¼ of the photoresist.

7. The method of manufacturing a semiconductor as claimed in claim 1 wherein the low dielectric constant layer has an extinction coefficient which can be optimized to reduce reflectivity.

8. The method of manufacturing a semiconductor as claimed in claim 1 wherein the low dielectric constant layer has optical constants which can be optimized to reduce reflectivity to under 15% reflectivity.

9. A method of manufacturing a semiconductor comprising the steps of:

providing a silicon substrate;

forming a plurality of semiconductor devices on and in the silicon substrate, said plurality of semiconductor devices having a plurality of source and drain junctions and gates;

depositing a dielectric layer over the semiconductor substrate and the plurality of semiconductor devices;

chemical mechanical polishing the dielectric layer to form a planar surface;

depositing a low dielectric constant material on the planar surface over the dielectric layer, the low dielectric constant layer having an extinction coefficient below 0.2;

depositing a photoresist on the low dielectric constant layer;

processing the photoresist to pattern contacts and local interconnects for the plurality of source and drain junctions and gates; and processing the low dielectric constant layer and the dielectric layer to form contacts and local interconnects for the plurality of source and drain junctions and gates.

10. The method of manufacturing a semiconductor as claimed in claim 9 wherein the step of depositing a low dielectric constant layer uses a material having a dielectric constant below 4.0 as a bottom anti-reflective layer.

11. The method of manufacturing a semiconductor as claimed in claim 9 wherein the step of depositing a dielectric layer uses a material having a dielectric constant above 24.0 as an inter layer dielectric layer.

12. The method of manufacturing a semiconductor as claimed in claim 9 wherein the step of depositing the dielectric layer uses a material selected from a group consisting of BPTEOS, PETEOS, TEOS, and combinations thereof as an inter layer dielectric layer.

13. The method of manufacturing a semiconductor as claimed in claim 9 wherein the low dielectric constant layer uses a material selected from a group consisting of Flare, Silk, SCB, and combinations thereof as a bottom anti-reflective layer.

14. The method of manufacturing a semiconductor as claimed in claim 9 wherein the low dielectric constant layer has a thickness ratio of ¼ the thickness of the photoresist as a bottom anti-reflective layer.

15. The method of manufacturing a semiconductor as claimed in claim 9 wherein the low dielectric constant layer has an extinction coefficient under 2.0.

16. The method of manufacturing a semiconductor as claimed in claim 9 wherein the low dielectric constant layer has a has optical constants optimized to reduce reflectivity to under 15% reflectivity whereby the low dielectric constant layer acts as a bottom anti-reflective layer.

* * * * *